United States Patent
Park et al.

(10) Patent No.: US 8,390,309 B2
(45) Date of Patent: Mar. 5, 2013

(54) APPARATUS AND METHOD FOR INSPECTING HOMOGENEITY OF SOLAR CELL QUANTUM EFFICIENCY USING IMAGING DEVICE

(75) Inventors: Seung Nam Park, Daejeon (KR); Dong-Hoon Lee, Daejeon (KR); Seongchong Park, Daejeon (KR); Chul Woung Park, Daejeon (KR); Seung Kwan Kim, Daejeon (KR); Ji Soo Hwang, Daejeon (KR); Yong Shim Yoo, Daejeon (KR); Dong-Joo Shin, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 21 days.

(21) Appl. No.: 13/131,171

(22) PCT Filed: Dec. 30, 2009

(86) PCT No.: PCT/KR2009/007977
§ 371 (c)(1),
(2), (4) Date: May 25, 2011

(87) PCT Pub. No.: WO2010/123189
PCT Pub. Date: Oct. 28, 2010

(65) Prior Publication Data
US 2011/0227598 A1 Sep. 22, 2011

(30) Foreign Application Priority Data
Apr. 20, 2009 (KR) ........................ 10-2009-0033988

(51) Int. Cl.
*G01R 31/26* (2006.01)

(52) U.S. Cl. ................. 324/761.01; 324/762.01; 324/96
(58) Field of Classification Search ............. 324/761.01
See application file for complete search history.

(56) References Cited

U.S. PATENT DOCUMENTS
4,528,503 A * 7/1985 Cole .................... 324/761.01
4,609,291 A * 9/1986 Takahashi .................... 356/418
(Continued)

FOREIGN PATENT DOCUMENTS
JP 2003-057114 A 2/2003
JP 2005-197432 A 7/2005
(Continued)

OTHER PUBLICATIONS
International Search Report for PCT/KR2009/007977 dated Aug. 10, 2010.

*Primary Examiner* — Richard Isla Rodas
(74) *Attorney, Agent, or Firm* — Jenkins, Wilson, Taylor & Hunt, P.A.

(57) ABSTRACT

The present invention relates to an apparatus and a method for inspecting quantum efficiency homogeneity of a solar cell using a spatial light modulating device. The apparatus includes a light emitting device configured to radiate predetermined light; a spatial light modulating device configured to change a light path of rays emitted from the light emitting device according to individual control of a plurality of pixels; a spatial light modulating device controller configured to individually control the states of the plurality of pixels; a solar cell which the rays passing through or reflected from the spatial light modulating device irradiate; and a calculation controller configured to calculate quantum efficiency of the solar cell based on a photocurrent signal generated from the solar cell.

14 Claims, 5 Drawing Sheets

U.S. PATENT DOCUMENTS

| | | | |
|---|---|---|---|
| 4,730,930 A * | 3/1988 | Thoreson et al. | 356/407 |
| 5,955,885 A * | 9/1999 | Kurokami et al. | 324/426 |
| 6,154,038 A * | 11/2000 | Ito et al. | 324/754.23 |
| 6,563,577 B2 * | 5/2003 | Oomori et al. | 356/237.2 |
| 6,639,421 B1 * | 10/2003 | Yoshino et al. | 324/761.01 |
| 6,946,858 B2 * | 9/2005 | Matsuyama | 324/761.01 |
| 7,164,109 B2 * | 1/2007 | Jeong et al. | 250/203.4 |
| 7,528,615 B2 * | 5/2009 | Shimotomai | 324/754.23 |
| 2006/0214673 A1 * | 9/2006 | Tamai | 324/753 |
| 2010/0236035 A1 * | 9/2010 | Chung | 29/25.01 |

FOREIGN PATENT DOCUMENTS

| | | |
|---|---|---|
| JP | 2008-032549 A | 2/2008 |
| KR | 10-1999-0007476 | 1/1999 |

* cited by examiner

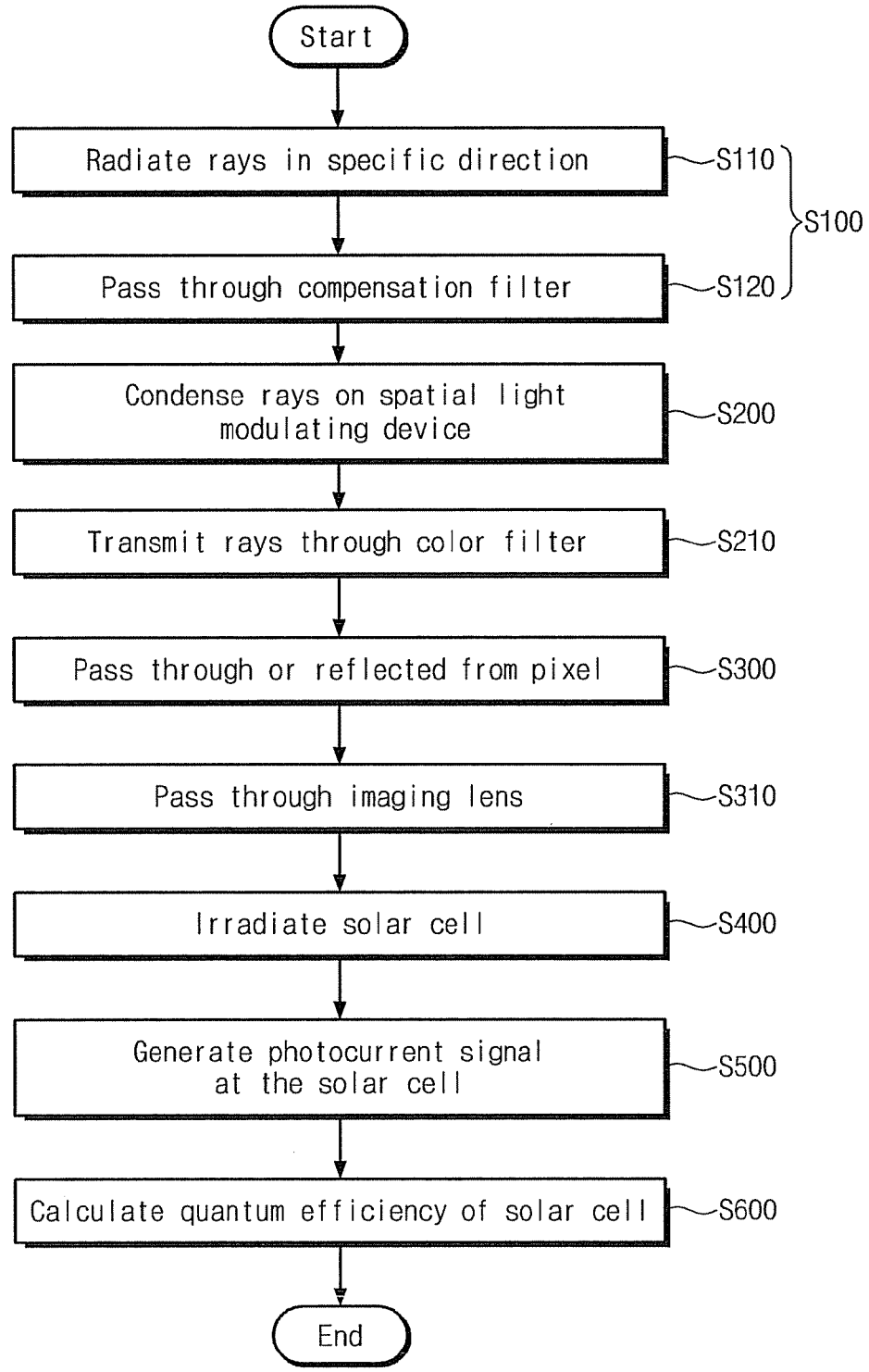

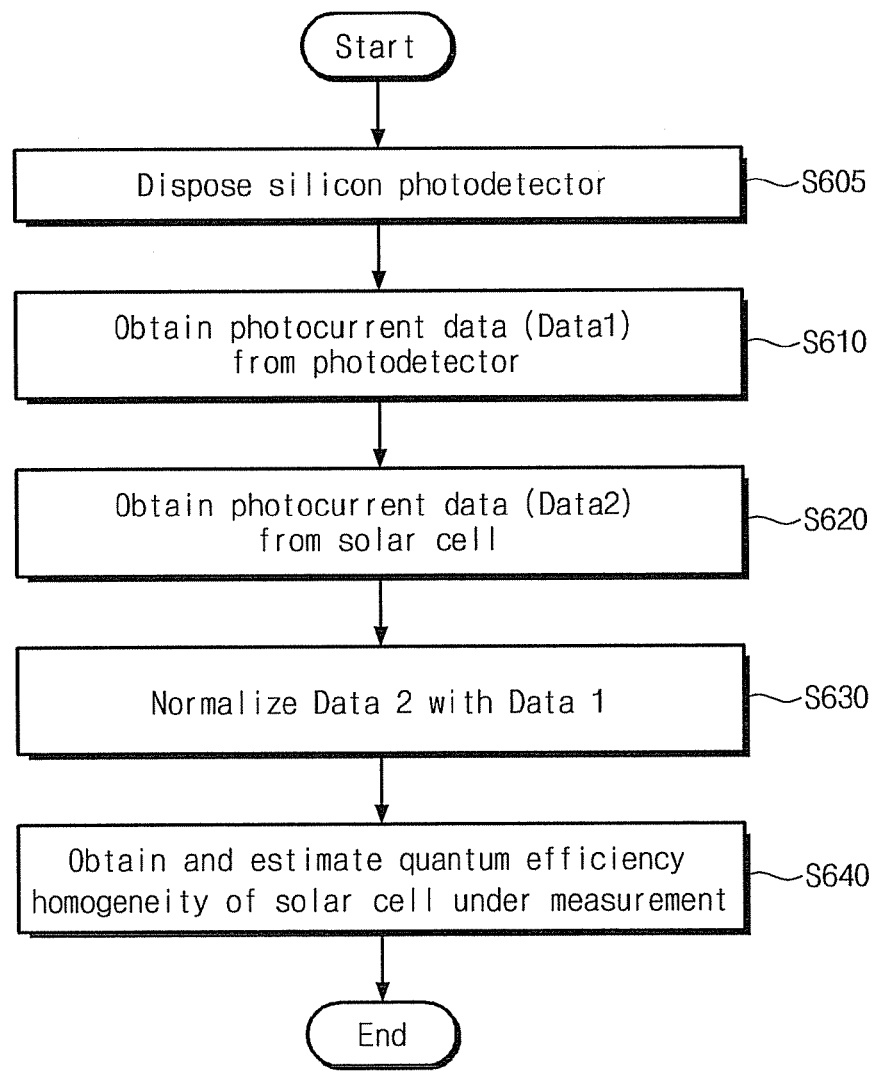

APPARATUS AND METHOD FOR INSPECTING HOMOGENEITY OF SOLAR CELL QUANTUM EFFICIENCY USING IMAGING DEVICE

CROSS-REFERENCE TO RELATED APPLICATIONS

The U.S. non-provisional patent application claims priority under 35 U.S.C. §119 to Korean Patent Application No. 10-2009-0033988, filed on Apr. 20, 2009, the entirely of which is hereby incorporated by reference.

BACKGROUND OF THE INVENTION

1. Field of the Invention

The present invention generally relates to apparatuses and methods for inspecting quantum efficiency homogeneity of a solar cell. More specifically, the present invention is directed to an apparatus and a method for inspecting quantum efficiency homogeneity of a solar cell using a spatial light modulating device such as a liquid crystal display (LCD) or a digital micromirror device (DMD). The quantum efficiency homogeneity of a solar cell can be regarded equivalent to the spatial uniformity of power conversion efficiency of a solar cell.

2. Description of the Related Art

A solar cell is a device that is irradiated by sunlight to generate electric power. However, when sunlight irradiates a portion of a solar cell, only a fraction of electric power proportional to a ratio of an irradiated area to the whole area is generated in case that its quantum efficiency is uniform In general, photocurrent generated from an irradiated portion of a solar cell may be measured when white light or laser beam is locally focused on the solar cell through a lens. Quantum efficiency homogeneity of the solar cell may be achieved by scanning the light beam and two-dimensionally mapping the photocurrent.

Since the quantum efficiency homogeneity may be deteriorated by local material defects, cracks or abnormal operations inside a solar cell, the measurement is required during research, manufacturing, and inspection of a solar cell. In addition, a lifetime of a solar cell may be predicted by observing the change of the quantum efficiency homogeneity while exposing the solar cell to a severe environment.

Conventionally, several methods have been used to inspect quantum efficiency homogeneity of a solar cell. One of the methods is that a solar cell is mounted on a two-axis translation stage and it is two-dimensionally scanned while irradiated by a light source. Inversely, a light source or a light delivering optical fiber is mounted to a two-axis translation stage and scans over the solar cell with irradiation. The light source can be either white light or monochromatic light.

Alternatively, a laser beam is launched onto a lens and an incident angle of the laser beam is mechanically or electrically controlled to change a falling position of the beam on a solar cell, and the photocurrent is measured.

However, since this method is accompanied by mechanical movements, measurement time becomes long and measurement accuracy is affected by vibration and acoustic noise.

Besides, an additional optical system must be used to control the size of an irradiating ray which determines a spatial resolution of quantum efficiency measurement. Moreover, it is not easy to control the size of the irradiating ray automatically.

Furthermore, the two-axis translation stage must be substituted with a new one having a large moving range to increase the inspection area of a solar cell.

Accordingly, there has been a need for an apparatus and a method for inspecting quantum efficiency homogeneity of a solar cell, which provides not only accuracy but also convenient control for the inspection.

SUMMARY OF THE INVENTION

Embodiments of the present invention provide an apparatus and method for inspecting quantum efficiency homogeneity of a solar cell using a spatial light modulating device.

According to the apparatus and the method, generation of vibration and noise may be prevented by eliminating mechanical movements while quantum efficiency homogeneity is being inspected through irradiation of the ray on a solar cell. Thus, an accurate inspection for the quantum efficiency homogeneity may be achieved.

Also according to the apparatus and the method, the number and pattern of image pixels on a solar cell plane may be controlled by switching the pixels of a spatial light modulating device when quantum efficiency homogeneity is inspected through irradiation of light on a solar cell. Thus, a simple and effective inspection for the quantum efficiency homogeneity may be achieved.

Also according to the apparatus and the method, the size of an irradiating ray determining a spatial resolution of quantum efficiency may be automatically adjusted without the use of an additional optical system.

In some embodiments of the present invention, the apparatus may include a light emitting device configured to radiate predetermined light; a spatial light modulating device configured to change the light paths of rays emitted from the light emitting device according to individual control of a plurality of pixels of the spatial light modulating device; a controller of the spatial light modulating device configured to individually control transmission or reflection states of its pixels; a solar cell which the rays passing through or reflected from the spatial light modulating device irradiates; and a calculation controller configured to calculate quantum efficiency of the solar cell based on the photocurrent generated from the solar cell. The term 'photocurrent' used throughout this statement is the electric current generated from a solar cell with or without forward voltage applied to the solar cell. With zero forward voltage formed across the solar cell, the photocurrent is equivalent to the short circuit current.

Preferably, the light emitting device may be an artificial sunlight generating device such as a solar simulator configured to generate artificial sunlight.

Preferably, the artificial sunlight generating device may include a Xenon lamp and a reflector configured to collect light generated from the Xenon lamp. Preferably, the artificial sunlight generating device may further include a compensation filter configured to form a standard spectral distribution of the sunlight.

Preferably, the apparatus may further include a condensing lens configured to condense the rays from the light emitting device on the spatial light modulating device.

Preferably, the spatial light modulating device may be a liquid crystal display (LCD) device configured to allow the rays to pass therethrough or block the rays. Preferably, the spatial light modulating device may be a digital micromirror device configured to reflect the rays into predetermined paths or away from them.

Preferably, the apparatus may further include a display unit configured to display the quantum efficiency calculated in the calculation controller.

Preferably, the calculation controller may include a current-to-voltage converter configured to convert the photocurrent generated from the solar cell to a voltage signal and an analog-to-digital converter configured to convert the voltage signal to a digital signal.

Preferably, the apparatus may further include a color filter configured to transmit, of the artificial sunlight, rays within a specific wavelength band to pass therethrough.

Preferably, the color filter may further include a color filter rotating device configured to insert a plurality of color filters of respective wavelength bands into the light path.

Preferably, the apparatus may further include an imaging lens disposed between the spatial light modulating device and the solar cell to have the artificial sunlight irradiate the solar cell.

In other embodiments of the present invention, the method may include a radiating step in which predetermined light is radiated by a light emitting device; a condensing step in which rays emitted from the light emitting device are condensed on a spatial light modulating device capable of controlling a plurality of pixels individually; a passing or reflecting step in which the rays pass through or are reflected from predetermined pixels of a spatial light modulating device according to a control command to the individual pixel via a spatial light modulating device controller; an irradiating step in which the rays passing through or reflected from the corresponding pixels irradiate a solar cell; a generating step in which a photocurrent is generated from the solar cell irradiated by the ray; and a calculating step in which a calculation controller calculates quantum efficiency based on the photocurrent.

Preferably, the radiating step includes a reflecting step in which rays emitted from a Xenon lamp are reflected from a reflector to have a specific direction; and a passing step in which the rays pass through a compensation filter to have a standard spectral distribution of artificial sunlight.

Preferably, the condensing step may include a transmitting step in which, of the artificial sunlight, rays within a predetermined wavelength band are transmitted through a color filter inserted into a color filter rotation device.

Preferably, between the passing or reflecting step and the irradiating step, the method may further include a passing step in which the rays pass through an imaging lens disposed between the spatial light modulating device and the solar cell.

Preferably, the calculating step may include a first obtaining step in which photocurrent data generated from a photodetector or a photodetector array having uniform spatial response are obtained in the calculation controller; a second obtaining step in which photocurrent data generated from the solar cell are obtained in the calculation controller; a converting step in which the calculation controller converts the photocurrent data of the solar cell to normalized photocurrent data by taking the ratio of the photocurrent of the solar cell to the photocurrent of the photodetector or photodetector array position by position; and an obtaining step in which quantum efficiency homogeneity of the solar cell is obtained based on the normalized photocurrent data.

Preferably, before the first obtaining step is carried out, the method may further include a disposing step in which a photodetector on a two-axis translation stage, or a photodetector array on a single axis translation stage is disposed at a location of the solar cell.

BRIEF DESCRIPTION OF THE DRAWINGS

FIG. 4 is a flowchart illustrating a light path in an inspecting apparatus and an inspecting method according to the present invention.

FIG. 5 is a flowchart illustrating a method for calculating quantum efficiency of a solar cell.

DETAILED DESCRIPTION OF EMBODIMENTS

Figure 1:
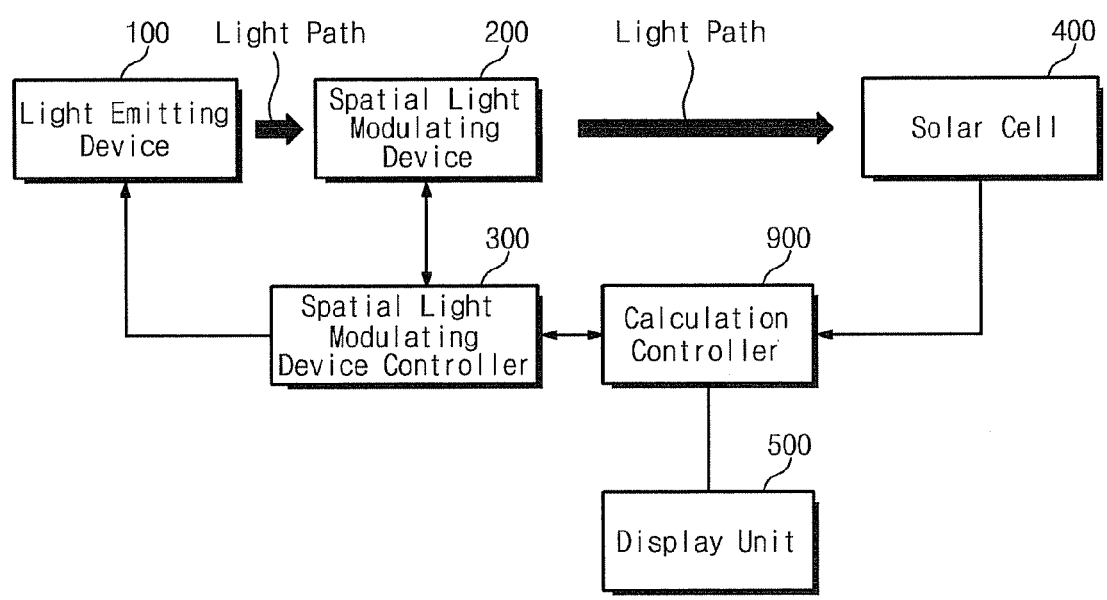
FIG. 1 is a schematic diagram of the present invention.

FIG. 1 is a schematic diagram of the present invention. As illustrated in FIG. 1, an apparatus for inspecting quantum efficiency homogeneity of a solar cell using a spatial light modulating device is basically comprised of a light emitting device 100, a spatial light modulating device 200, a spatial light modulating device controller 300, a solar cell 400, and a display unit 500, and a calculation controller 900. Embodiments of the present invention will now be described more fully hereinafter with reference to accompanying drawings.

[Embodiment 1]

Figure 2:
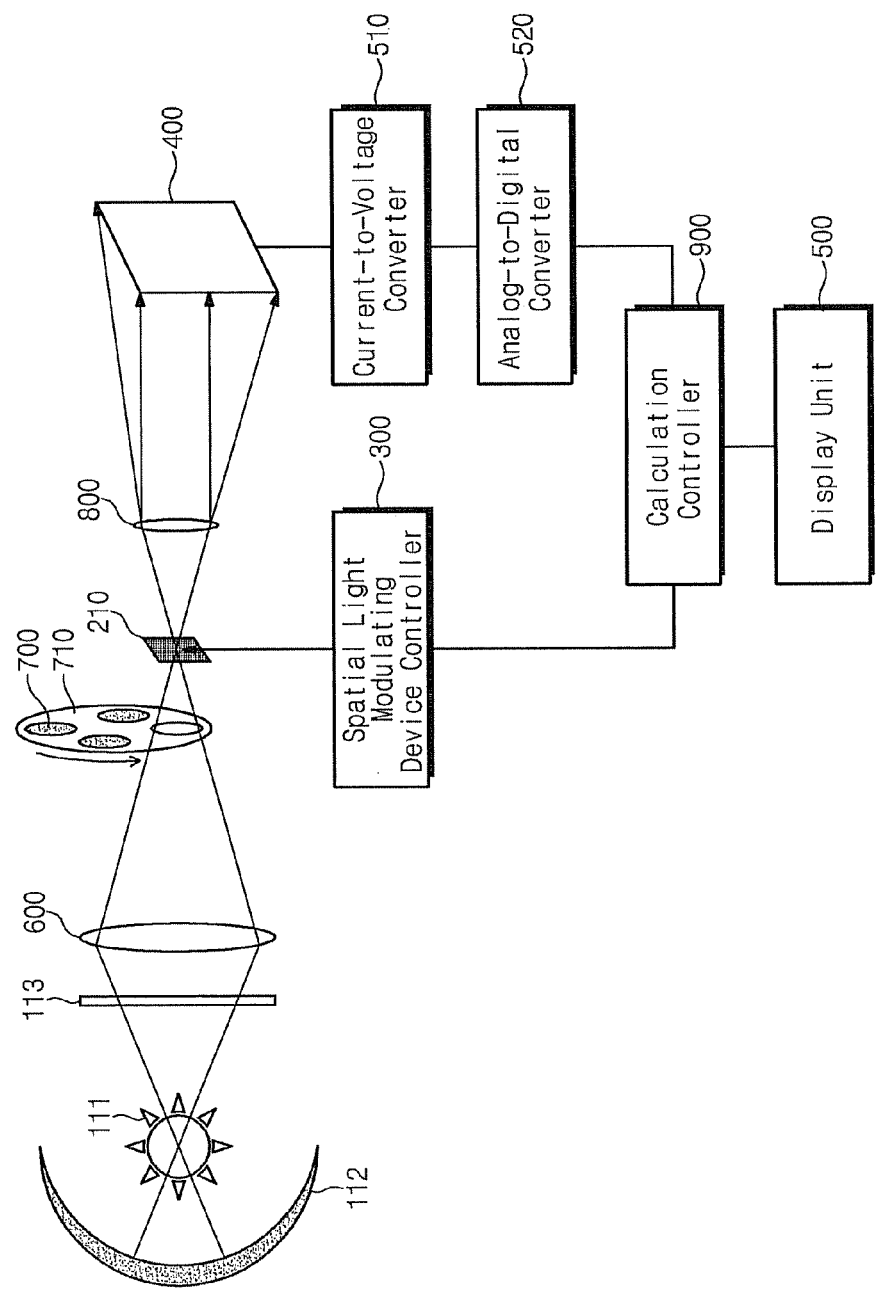
FIG. 2 illustrates a first embodiment of the present invention.

FIG. 2 illustrates a first embodiment of the present invention. As illustrated in FIG. 2, a light emitting device 100 may be provided to generate desired rays of light. A condensing lens 600, a liquid crystal display (LCD) device 210, a color filter 700, an imaging lens 800, and a solar cell 400 may be provided on a light path to have artificial sunlight irradiate the solar cell 400.

A spatial light modulating device controller 300 for allowing desired rays of light to pass therethrough, a display unit 500 for displaying photocurrent generated by irradiation of artificial sunlight, and a calculation controller 900 may be further provided to constitute an apparatus for inspecting quantum efficiency homogeneity of a solar cell using a liquid crystal display (LCD) device 210.

The apparatus will now be described below with reference to FIG. 2.

The light emitting device 100 employs an artificial sunlight generator 110 to generate light that is similar to the real sunlight. The artificial sunlight generator 110 includes a Xenon lamp 111, a reflector 112, and a compensation filter 113.

The use of the Xenon lamp 111 has priority over other light sources because they have different spectral distributions from the spectrum emitted from the sun. Since the spectral distribution using the Xenon lamp 111 doest not perfectly match to AM1.5 standard spectral distribution, the compensation filter 113 is further provided to achieve more precise spectrum.

The reflector 112 serves to condense light emitted from the Xenon lamp 111 into a predetermined direction.

The LCD device 210 disposed in a light path has a plurality of pixels to match a specific portion of the solar cell 400. A specific scanning method may be selected using the spatial light modulating device controller 300 for controlling the switch of the pixels.

The spatial light modulating device controller 300 may be a computer or a pattern generator. The spatial light modulating device controller 300 may switch pixels one by one, or it may switch a group of pixels pattern by pattern. For example, the spatial light modulating device controller 300 may switch the whole pixels in a column, row, square, or rectangle to reduce the inspection time.

The spatial light modulating device controller 300 is connected to the calculation controller 900, which enables the calculation controller 900 to receive the scanning pattern information from the spatial light modulating device controller 300 to analyze and display photocurrent data of the solar cell 400 on the display unit 500.

The solar cell 400 is an inspection target of quantum efficiency homogeneity. The specific rays transmitting through the LCD device 210 are converted to photocurrent and it is delivered to the display unit 500.

The display unit 500 may further include a current-to-voltage converter 510 and an analog-to-digital converter 520 to display photocurrent information. That is, the current-to-voltage converter 510 converts photocurrent generated from a solar cell portion corresponding to pixels of the LCD device 210 to a voltage signal, the analog-to-digital converter 520 converts an analog voltage signal passing through the current-to-voltage converter 510 to a digital signal, and the display unit 500 displays the digital signal passing through the analog-to-digital converter 520 as a visual graphic image.

The condensing lens 600 may be disposed to condense artificial sunlight on the LCD device 210.

The color filter 700 may be disposed in front of or at the back of the spatial light modulating device 200 on the light path and use various colors to measure quantum efficiency homogeneity of the solar cell 400 according to wavelength band.

For convenient use of the color filter 700, the color filter 700 includes a color filter rotation device 710. As the color filters 700 circularly mounted at the color filter rotation device 710 are rotating, quantum efficiency homogeneity may be measured at each color.

The imaging lens 800 may be a convex lens or a combination of convex and concave lenses, which is configured such that the light passing through the LCD device 210 can accurately irradiate the solar cell.

[Embodiment 2]

Figure 3:
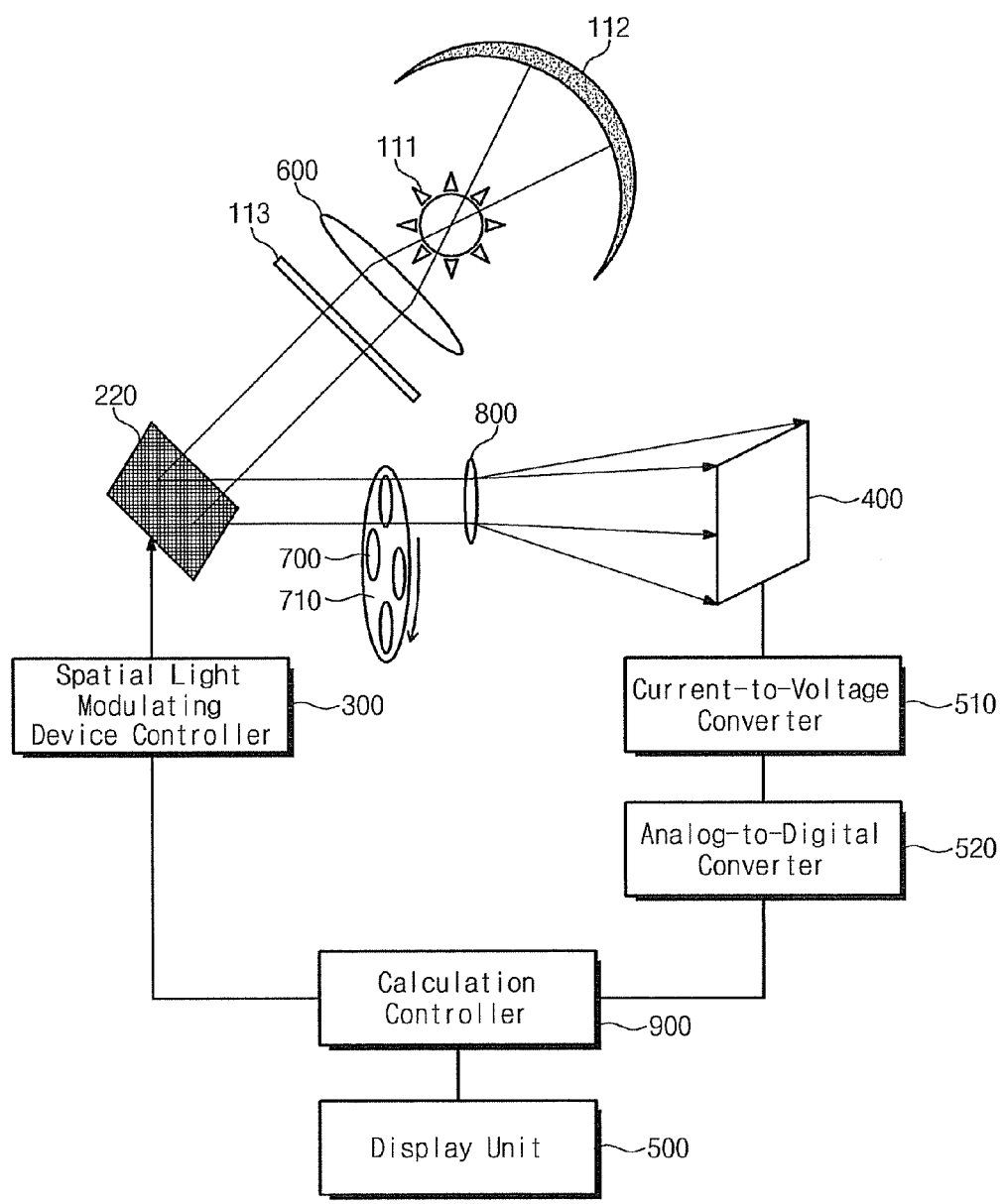
FIG. 3 illustrates a second embodiment of the present invention.

FIG. 3 illustrates a second embodiment of the present invention.

According to the second embodiment of the present invention, a light emitting device 100 is provided to generate desired rays of light, and a condensing lens 600, a digital micromirror device (DMD) 220, a color filter 700, an imaging lens 800, and a solar cell 400 may be provided on a light path to have artificial sunlight irradiate the solar cell 400.

A spatial light modulating device controller 300 for allowing desired rays of light to pass therethrough, a display unit 500 for displaying photocurrent generated by irradiation of artificial sunlight, and a calculation controller 900 are further provided to constitute an apparatus for inspecting quantum efficiency homogeneity of a solar cell using the digital micromirror device 220.

An artificial sunlight generation device 110 is employed as the light emitting device 100. Similar to the first embodiment, the artificial sunlight generation device 110 includes a Xenon lamp 111, a reflector 112, and a compensation filter 113.

The digital micromirror device 220 is composed of numerous micromirrors. Each micromirror corresponds to a pixel. The reflecting direction of each micromirror can be automatically controlled according to a scanning pattern command and thus the each micromirror can change the propagating direction of incoming rays. Thus, of the artificial sunlight emitted from the artificial sunlight generation device 110, only a specific group of rays is reflected and directed to the solar cell 400 and the other rays are reflected away from the solar cell 400 in order to achieve a desired function of the spatial light modulating device.

Similar to the first embodiment, a specific pixel may be automatically controlled and a specific scanning method may be selected using the spatial light modulating device controller 300. Also similar to the first embodiment, the spatial light modulating device controller 300 may be a computer or a pattern generator.

However, there is a difference between the second embodiment and the first embodiment. That is, while the first embodiment is characterized in that a pixel is switched to control a specific ray, the second embodiment is characterized in that a reflection direction of a pixel is adjusted and a plurality of pixels are controlled, after grouping the pixels, to have the same reflection direction.

The condensing lens 600 is provided to condense the artificial sunlight emitted from the artificial sunlight generation device 110 on the digital micromirror device 220 and employs a convex lens.

Similar to the first embodiment, the color filter 700 and a color filter rotation device 710 are further provided to have rays of respective wavelength band irradiate the solar cell 400.

Also similar to the first embodiment, a convex lens or a combination of convex and concave lenses is employed as an imaging lens 800, and the display unit 500 further includes a current-to-voltage converter 510 and an analog-to-digital converter 520 to display a digital signal as a visual graphic image.

[Inspecting Method]

FIG. 4 is a flowchart illustrating a light path in an inspecting apparatus and an inspecting method according to the present invention. The light path is now explained with reference to the flowchart in FIG. 4. Predetermined light is radiated from a light emitting device 110 (S100). In case of this embodiment where the light emitting device 100 is an artificial sunlight generating device 110, rays emitted from a Xenon lamp 111 are reflected to a reflector 112 to travel in a predetermined direction (S110). The reflected rays pass through a compensation filter 113 to have a standard spectral distribution of artificial sunlight (S120).

Next, the artificial sunlight passes through a condensing lens 600 to be condensed on a spatial light modulating device 200 (S200). Of the artificial sunlight, rays within a specific wavelength band pass through a color filter 700 inserted into a color filter rotation device 710 (S210).

Next, the rays pass through or are reflected from pixels according to specific pixel control commands of a spatial light modulating device controller 300 (S300). After passing through an imaging lens 800 disposed between the spatial light modulating device 200 and a solar cell 400 (S310), the rays irradiate the solar cell 400 corresponding to the pixels (S400).

As set forth above, when light travels to irradiate the solar cell 400, a photocurrent is generated (S500). A calculation controller 900 outputs quantum efficiency information of a solar cell through obtaining and converting the photocurrent (S600).

However, since the irradiance of rays on a solar cell 400 under measurement from each pixel of the spatial light modulating device 200 is not completely uniform, photocurrent data (Data 1 and Data 2) must be secured to inspect quantum efficiency homogeneity after implementing the apparatus, as follows.

A method for calculating quantum efficiency homogeneity of a solar cell will now be described below with reference to FIG. 5.

Instead of the solar cell 400 under measurement in the inspecting apparatus according to the first and second embodiments, a photodetector (not shown) including a two-axis translation stage or a photodetector array including a single-axis translation stage is installed at the position of the solar cell 400 under measurement (S605). The photodetector or photodetector array may employ a silicon photodetector or silicon photodetectors and must have uniform spatial response.

The above steps (S100~S500) of artificial sunlight irradiation on a solar cell 400 are iteratively repeated to a photodetector or a photodetector array instead of the solar cell 400.

Photocurrent data (Data 1) generated from the silicon photodetector are obtained at a calculation controller 900 (S610). When the solar cell 400 is substituted for the silicon photodetector and irradiated by the artificial sunlight, photocurrent data (Data 2) generated from the solar cell 400 under measurement is obtained at the calculation controller 900 (S620). Then, the calculation controller 900 calculates the normalized photocurrent data by taking the ratio of the photocurrent data (Data 2) of the solar cell 400 to the photocurrent data (Data 1) of the photodetector (S630) position by position.

Quantum efficiency homogeneity of the solar cell 400 can be evaluated based on the information on quantum efficiency distribution of the solar cell 400 obtained through the normalized photocurrent data (S640).

The photocurrent data (Data 1) corresponding to the spectral irradiance of rays remains nearly unchanged unless characteristics of the Xenon lamp 111 are changed. Therefore, the photocurrent data (Data 1) obtained once is stored in a memory device and may be used again to inspect quantum efficiency homogeneity of other solar cells continually.

As described so far, when rays irradiate a solar cell to inspect its quantum efficiency homogeneity, mechanical movements are eliminated to prevent generation of vibration and noise and to accurately inspect the homogeneity. Thus, the accuracy of the inspection can be enhanced.

When rays irradiate a solar cell to inspect its quantum efficiency homogeneity, pixel switching or the like of a spatial light modulating device can be automatically controlled and the number and pattern of pixels can be automatically selected. Thus, the inspection can be conducted simply and conveniently, and the inspection time can be reduced.

An additional optical system for adjusting the irradiating area of rays determining a spatial resolution of quantum efficiency is not used. Thus, the manufacturing cost of the inspecting apparatus can be reduced to make the inspecting apparatus economical.

Although the present invention has been described in connection with the embodiments of the present invention illustrated in the accompanying drawings, it is not limited thereto. It will be apparent to those skilled in the art that various substitutions, modifications and changes may be made without departing from the scope and spirit of the present invention.

What is claimed is:

1. An apparatus for inspecting quantum efficiency homogeneity of a solar cell using a spatial light modulating device, the apparatus comprising:
a light emitting device configured to radiate predetermined light;
a spatial light modulating device configured to change a light path of rays emitted from the light emitting device according to individual control of a plurality of pixels;
a spatial light modulating device controller configured to individually control the states of the plurality of pixels;
a solar cell on which the rays passing through or reflected from the spatial light modulating device irradiate;
a condensing lens configured to condense the light from the light emitting device onto the spatial light modulating device; and
a calculation controller configured to calculate quantum efficiency of the solar cell based on photocurrent signals generated from the solar cell, wherein the spatial light modulating device is a digital micromirror device configured to reflect the rays.

2. The apparatus as set forth in claim 1, wherein the light emitting device is an artificial sunlight generating device configured to generate artificial sunlight.

3. The apparatus as set forth in claim 2, wherein the artificial sunlight generating device comprises:
a Xenon lamp; and
a reflector configured to collect light generated from the Xenon lamp.

4. The apparatus as set forth in claim 3, wherein the artificial sunlight generating device further comprises:
a compensation filter configured to make the light collected through the reflector have standard spectral distribution.

5. The apparatus as set forth in claim 2, further comprising:
a color filter configured to allow, of the artificial sunlight, rays within a specific wavelength band to pass there through.

6. The apparatus as set forth in claim 5, wherein the color filter further comprises:
a color filter rotation device configured to have a plurality of color filters of respective wavelengths inserted on the light path.

7. The apparatus as set forth in claim 2, further comprising:
an imaging lens or lenses disposed between the spatial light modulating device and the solar cell to have the artificial sunlight irradiate onto the solar cell.

8. The apparatus as set forth in claim 1, further comprising:
a display unit configured to display the quantum efficiency calculated in the calculation controller.

9. The apparatus as set forth in claim 1, wherein the calculation controller comprises:
a current-to-voltage converter configured to convert photocurrent generated from the solar cell to a voltage signal; and
an analog-to-digital converter configured to convert the voltage signal to a digital signal.

10. A method for inspecting quantum efficiency of a solar cell using a spatial light modulating device, the method comprising:
a first radiating step in which predetermined light radiates from a light emitting device;
a condensing step in which rays emitted from the light emitting device are condensed on a spatial light modulating device with a plurality of pixels individually controllable
a reflecting step in which the rays are reflected from a predetermined pixel of a spatial light modulating device according to a control command of a spatial light modulating device controller
an irradiating step in which rays corresponding to the pixels irradiate a solar cell;
a generating step in which a photocurrent signal is generated from the solar cell irradiated by the rays; and
a calculating step in which a calculation controller calculates quantum efficiency based on the photocurrent signal, wherein the calculating step comprises:
a first obtaining step in which photocurrent data generated from a photodetector having uniform spatial response is obtained in the calculation controller;
a second obtaining step in which photocurrent data generated from the solar cell is obtained in the calculation controller;

a converting step in which the calculation controller converts the photocurrent data of the solar cell to normalized photocurrent data by taking the ratio of the photocurrent data of the solar cell to the photocurrent data of the photodetector; and a third obtaining step in which quantum efficiency homogeneity of the solar cell is obtained based on the normalized photocurrent data.

11. The method as set forth in claim 10, wherein the first radiating step comprises:
   a reflecting step in which rays emitted from a Xenon lamp are reflected from a reflector to have a specific direction; and
   a passing step in which the rays pass through a compensation filter to have a standard spectral distribution of artificial sunlight.

12. The method as set forth in claim 10, wherein the condensing step comprises:
   a transmitting step in which, of the artificial sunlight, rays within a predetermined wavelength band are transmitted through a color filter inserted into a color filter rotation device.

13. The method as set forth in claim 10, further comprising between the reflecting step and the irradiating step:
   a passing step in which the rays pass through an imaging lens or lenses disposed between the spatial light modulating device and the solar cell.

14. The method as set forth in claim 10, further comprising before the first obtaining step:
   a disposing step in which the photodetector including a two-axis translation stage or the photodetector array including a single-axis translation stage is disposed at a position of the solar cell.

* * * * *